United States Patent [19]
Lenhard

[11] Patent Number: 6,078,172
[45] Date of Patent: *Jun. 20, 2000

[54] CURRENT-COMPENSATED CURRENT SENSOR FOR HYSTERESIS-INDEPENDENT AND TEMPERATURE-INDEPENDENT CURRENT MEASUREMENT

[75] Inventor: Friedrich Lenhard, Hanau, Germany

[73] Assignee: Vacuumschmelze GmbH, Hanau, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/851,648

[22] Filed: May 6, 1997

[30] Foreign Application Priority Data

May 6, 1996 [DE] Germany ............... 196 18 114

[51] Int. Cl.[7] ....................................................... G01R 1/20
[52] U.S. Cl. ....................................................... 324/117 R
[58] Field of Search .......................... 324/117 R, 117 H, 324/127, 251, 252, 126; 336/201, 220, 221

[56] References Cited

U.S. PATENT DOCUMENTS

| | | | |
|---|---|---|---|
| 3,818,337 | 6/1974 | Groenenbroom et al. | 324/117 R |
| 4,314,200 | 2/1982 | Marek . | |
| 4,325,096 | 4/1982 | Sunohara et al. . | |
| 4,482,862 | 11/1984 | Leehey | 324/117 R |
| 5,309,086 | 5/1994 | Johansson et al. | 324/117 R |
| 5,508,606 | 4/1996 | Ryczek . | |

FOREIGN PATENT DOCUMENTS

| | | |
|---|---|---|
| 0 314 234 A1 | 5/1989 | European Pat. Off. . |
| 0 427 412 A2 | 5/1991 | European Pat. Off. . |
| 34 43 460 A1 | 6/1986 | Germany . |
| 40 19 810 A1 | 1/1991 | Germany . |
| 41 30 999 A1 | 3/1993 | Germany . |
| 42 29 948 A1 | 3/1994 | Germany . |
| 4229948A1 | 3/1994 | Germany . |
| 295 07 675 U1 | 8/1995 | Germany . |
| 96/20408 | 7/1996 | WIPO . |

OTHER PUBLICATIONS

"A New Current Sensor Based on the Measurement of the Apparent Coercive Field Stength" (Son et al.), 8096 IEEE Transactions on Instrumentation and Measurement, Dec. 1989, No.6, New York.

"Purpose Designed Ferrite Toroids for Isolated Current Measurement in Power Electronic Equipment" (Houldsworth), Electronic Components and Applications, vol. 3, No. 2, Feb. 1981.

*Primary Examiner*—Vinh P. Nguyen
*Attorney, Agent, or Firm*—Herbert L. Lerner; Laurence A. Greenberg; Werner H. Stemer

[57] ABSTRACT

A current-compensated current sensor for hysteresis-dependent and temperature-dependent measurement of even relatively large currents at different frequencies, includes a soft-magnetic magnet core having a flat magnetization loop. The sensor thus also permits rapid changes in a primary current to be measured.

3 Claims, 2 Drawing Sheets

CURRENT-COMPENSATED CURRENT SENSOR FOR HYSTERESIS-INDEPENDENT AND TEMPERATURE-INDEPENDENT CURRENT MEASUREMENT

BACKGROUND OF THE INVENTION

FIELD OF THE INVENTION

The invention relates to a current sensor having a soft-magnetic magnet core on which, in addition to a primary winding in which a current to be measured flows, at least one secondary winding is wound into which an alternating current is fed that saturates the magnet core alternately in at least one direction, and an evaluation circuit which determines a flux produced in the magnet core by the primary winding.

German Published, Non-Prosecuted Patent Application DE 42 29 948 A1 describes a current sensor having a soft-magnetic magnet core with a primary winding and a secondary winding. An additional current source is connected in series with the secondary winding and sends a magnetization current through the secondary winding. The magnetization current alternately drives the soft-magnetic magnet core into positive and negative saturation. The soft-magnetic magnet core has an essentially square magnetization characteristic, so that a respectively constant current flows during a remagnetization between two saturation states, since an inductive impedance tends to infinity because of a virtually vertical shape of the magnetization characteristic. In the positive and negative half-cycles, that current in each case differs from a mean value by a value which is governed by the hysteresis of the magnetization characteristic. The influence of hysteresis in the magnetization loop can be compensated for by averaging the constant current flowing during the remagnetization during two successive half-cycles of different polarity, so that the measurement of the current flowing in the secondary winding during the time in which the magnet core is being remagnetized results in a current which is directly proportional to the current to be measured in the primary winding.

SUMMARY OF THE INVENTION

It is accordingly an object of the invention to provide a current-compensated current sensor, which overcomes the hereinafore-mentioned disadvantages of the heretofore-known devices of this general type, which is particularly sensitive and which at the same time is insensitive to hysteresis and temperature influences, based on the compensation principle.

With the foregoing and other objects in view there is provided, in accordance with the invention, a current sensor, comprising a soft-magnetic magnet core formed of a material having a flat magnetization curve; a primary winding wound on the soft-magnetic magnet core for conducting a flow of a current to be measured; at least one secondary winding wound on the soft-magnetic magnet core for receiving an alternating current saturating the magnet core alternately in at least one direction, the alternating current flowing through the secondary winding being produced by an essentially sawtooth-waveform AC voltage; another winding wound on the soft-magnetic magnet core; an evaluation circuit determining a flux produced in the magnet core by the primary winding and comparing positive and negative current peaks through the secondary winding with one another; and an amplifier receiving the positive and negative current peaks through the secondary winding and having an output causing a compensation current to flow through the other winding.

In accordance with another feature of the invention, the other winding wound on the magnet core in addition to the primary winding and the secondary winding is a compensation winding.

In accordance with a further feature of the invention, there is provided a low-pass filter through which the compensation current is fed into the secondary winding, and high-pass filters through which the alternating current is fed into the secondary winding.

In accordance with a concomitant feature of the invention, there is provided a bridge amplifier configuration connected downstream of the evaluation circuit for matching to control or display devices having digital evaluation, the bridge amplifier configuration producing a reference voltage having only a positive or a negative value with respect to ground from an output voltage of the evaluation circuit having a polarity depending on a direction of a primary current to be measured in the primary winding.

Other features which are considered as characteristic for the invention are set forth in the appended claims.

Although the invention is illustrated and described herein as embodied in a current-compensated current sensor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
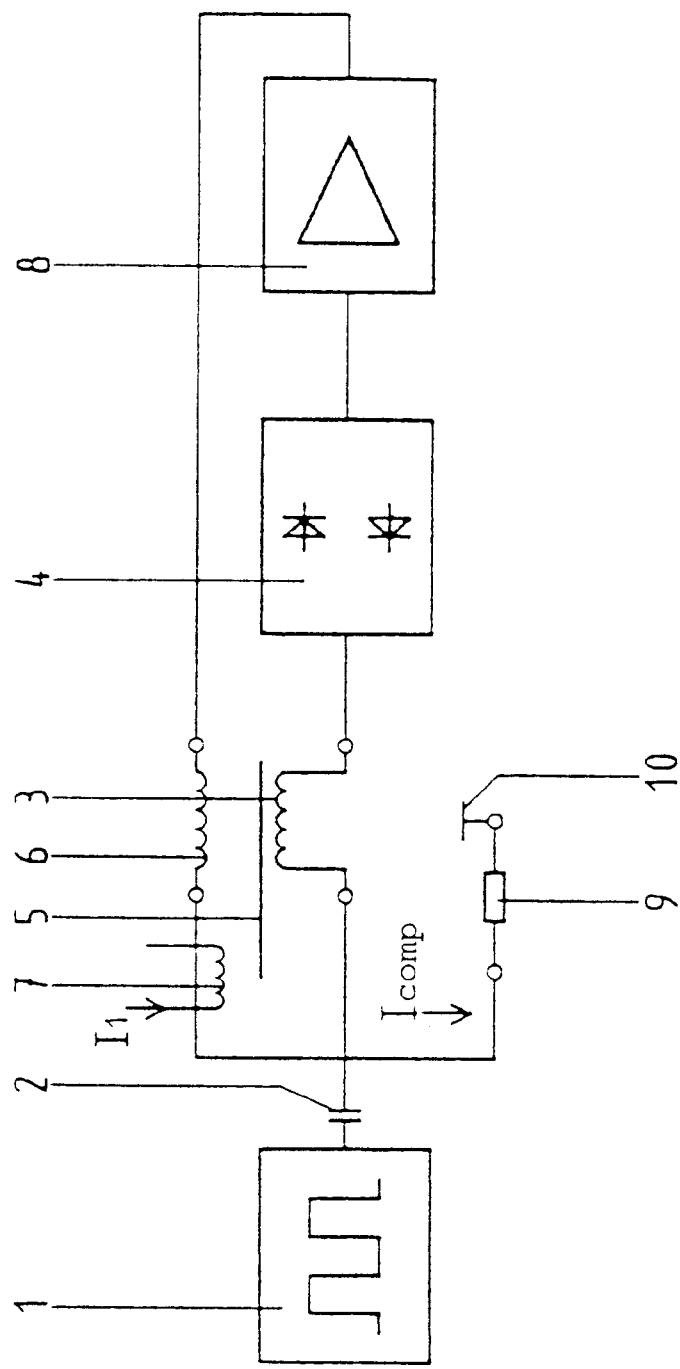
FIG. 1 is a schematic and block circuit diagram of a current sensor according to the invention.

Referring now to the figures of the drawings in detail and first, particularly, to FIG. 1 thereof, there is seen a square-waveform voltage generator 1 which is connected through a series capacitor 2 and a secondary winding 3 to an evaluation circuit 4. The secondary winding 3 is wound on a soft-magnetic magnet core 5, on which a compensation winding 6 and a primary winding 7 are also located. The evaluation circuit 4 is constructed in such a way that it detects positive and negative current peaks which flow through the secondary winding 3, and supplies an input of a downstream amplifier 8 with a voltage which corresponds to a mean value of the positive and negative current peaks.

According to the invention, the soft-magnetic magnet core 5 has a flat magnetization characteristic, that is to say a magnetization characteristic in which induction increases virtually linearly with field strength over a wide range.

Such a magnetization characteristic can be produced in soft-magnetic materials in particular by tempering in a cross field.

The square-waveform voltage generator 1 supplies a sawtooth-waveform voltage through the series capacitor 2 to the secondary winding 3, which produces an alternating current at a relatively high frequency in the secondary winding. According to the invention, the circuit is chosen in such a way that this current in the secondary winding is sufficient to drive the soft-magnetic magnet core alternatively into positive and negative saturation.

When no current is flowing through the other windings on the magnet core 5, then both the positive and the negative current peaks through the secondary winding 3 are of equal magnitude.

However, when a current to be measured is flowing in the primary winding 7 of the soft-magnetic magnet core 5, the latter is premagnetized, so that the alternating current which is produced in the secondary winding 3, for example in the positive direction, drives the magnet core into saturation more rapidly than in the negative direction. If the premagnetization is reversed by a reverse current in the primary winding 7, a positive current in the secondary winding 3 will lead to the magnet core 5 being saturated later, and a negative current will lead to saturation earlier. In consequence, different current peaks are produced in the secondary winding 3 in the two half-cycles.

The evaluation circuit 4 uses anti-parallel connected diodes to detect the value for both the positive and the negative peak current and to form a mean value therefrom. This mean value is essentially proportional to the premagnetization of the magnet core 5, and is thus proportional to the current to be measured in the primary winding 7. The amplifier 8 which connected to the output of the evaluation circuit 4 in turn has an output that drives a current through the compensation winding 6 which is also located on the soft-magnetic magnet core 5. Furthermore, a resistor 9 has a first terminal connected in series with the compensation winding 6 and a second terminal connected to ground 10. A voltage drop then occurs across this resistor, which is proportional to the current in the compensation winding 6 and thus also to the current in the primary winding 7 of the soft-magnetic magnet core 5. This proportionality results from the fact that the evaluation circuit 4, with the downstream amplifier 8, controls the compensation current in each case in such a way that the mean value of the positive and negative current peaks is equal to zero, so that there is no premagnetization in the magnet core 5.

This current sensor has the advantage of permitting even relatively large currents to be measured correctly, since the primary current does not cause any saturation of the magnet core 5. Furthermore, even relatively rapid current changes can be detected, since the magnet core has a flat magnetization characteristic and thus does not go straight into saturation in the event of sudden changes in the primary current, when the compensation current has not yet been matched. The mean-value voltage, which rises in consequence, makes it possible for the evaluation circuit 4 to recorrect the compensation current rapidly.

Figure 2:
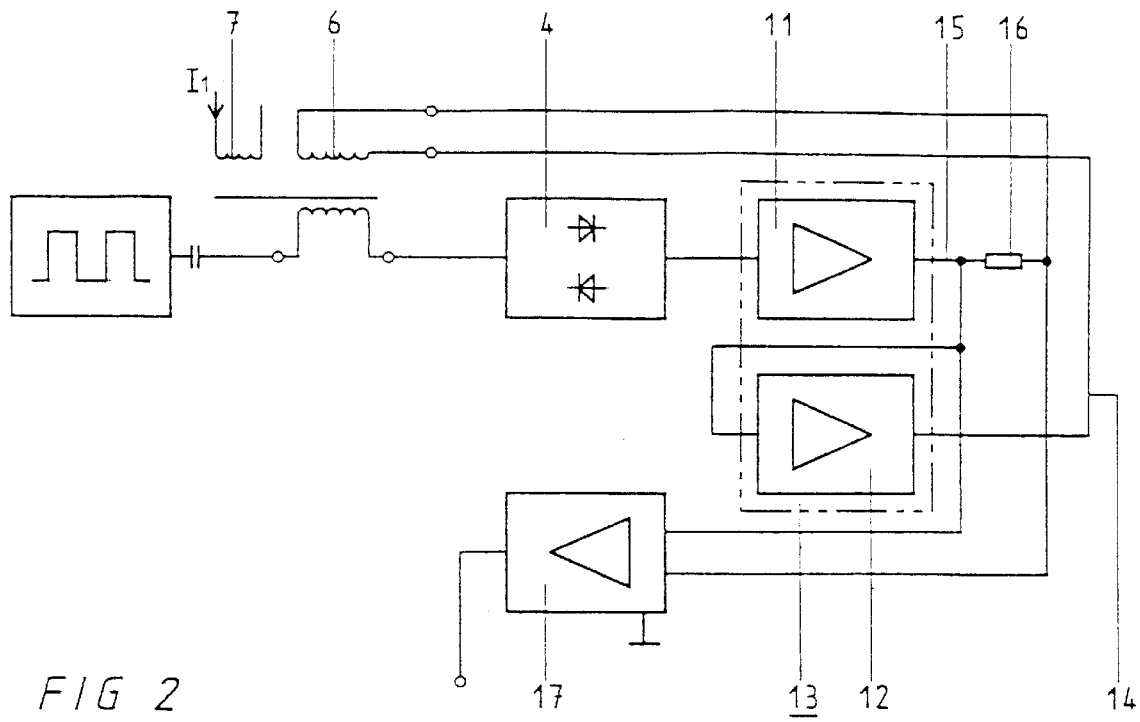
FIG. 2 is a schematic and block circuit diagram of an extension of the circuit illustrated in FIG. 1, in order to produce a reference voltage to ground, which is a voltage that is only positive or only negative.

A voltage which is proportional to the primary current to be measured in the primary winding 7 thus occurs across the resistor 9 and, in fact, depends on the polarity with respect to ground 10 of the direction of the current in the primary winding 7. If a reference voltage is then desired which is particularly suitable for evaluation in digital display or control devices, then it is desirable to have a voltage which has only one polarity (positive or negative) with respect to ground. With reference to FIG. 2, it is seen that in consequence it is possible to use a bridge amplifier configuration 13 instead of the amplifier 8. The bridge amplifier configuration 13 is formed of two amplifiers 11 and 12 and has outputs 14 and 15 that are connected to the terminals of the compensation winding 6. This results in a voltage across a resistor 16 which can be amplified through an additional amplifier 17 and in each case has only a positive or a negative value with respect to ground 10, irrespective of the direction of the current to be measured in the primary winding 7.

Figure 3:
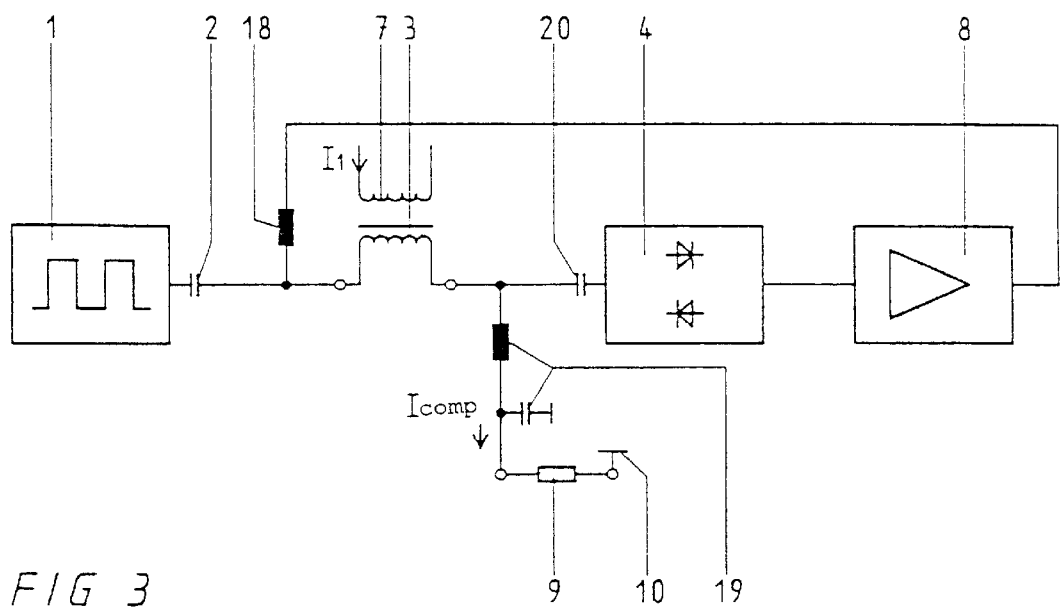
FIG. 3 is a schematic and block circuit diagram of an exemplary embodiment of the current sensor according to the invention, which manages with two windings for a magnet core.

A configuration which manages without the compensation winding 6 is illustrated in FIG. 3. The configuration is essentially similar to that according to FIG. 1, with the difference that the output of the amplifier 8 is connected through a low-pass filter, for example an inductance 18 acting as a low-pass filter, to the terminal of the secondary winding 3 which leads to the square-waveform voltage generator 1. The compensation current then likewise flows through the secondary winding 3 and from there through a low-pass filter 19, for example a low-pass filter including an inductance and a capacitance as well as through the resistor 9, to ground 10. In order to keep the low-frequency compensation current away from the evaluation circuit 4, a high-pass filter, for example a further capacitor 20, is connected between this evaluation circuit 4 and the low-pass filter 19.

I claim:

1. A current sensor, comprising:

a soft-magnetic magnet core formed of a material having a flat magnetization curve;

a primary winding wound on said soft-magnetic magnet core for conducting a flow of a current to be measured;

a secondary winding wound on said soft-magnetic magnet core for receiving an alternating current saturating said magnet core alternately in at least one direction;

an evaluation circuit determining a flux produced in said magnet core by said primary winding and comparing positive and negative current peaks through said secondary winding with one another;

an amplifier receiving the positive and negative current peaks through said secondary winding and having an output causing a compensation current to flow through said secondary winding;

a first and a second high-pass filter connected to said secondary winding for coupling the alternating current into said secondary winding; and a first low-pass filter connected between said secondary winding and said first high pass filter and a second low-pass filter connected between said secondary winding and said second high pass filter for coupling the compensation current into said secondary winding.

2. The current sensor according to claim 1, wherein said amplifier is a bridge amplifier configuration connected downstream of said evaluation circuit for matching to control or display devices having digital evaluation, said bridge amplifier configuration producing a reference voltage having only a positive or a negative value with respect to ground from an output voltage of said evaluation circuit having a polarity depending on a direction of a primary current to be measured in said primary winding.

3. The current sensor according to claim 1, including a voltage generator for generating the alternating current received by said secondary winding.

\* \* \* \* \*